United States Patent
Flanigan et al.

[11] Patent Number: 5,901,164
[45] Date of Patent: May 4, 1999

[54] DIRECT AMPLITUDE MODULATION OF LASERS

[75] Inventors: Barry John Flanigan, London; John Edward Carroll, Cambridge, both of United Kingdom

[73] Assignee: Northern Telecom Limited, Montreal, Canada

[21] Appl. No.: 08/865,760

[22] Filed: May 30, 1997

[51] Int. Cl.[6] .................................................. H01S 3/10
[52] U.S. Cl. .............................................. 372/26; 372/96
[58] Field of Search .................. 372/26, 31, 96, 372/102

[56] References Cited

U.S. PATENT DOCUMENTS 5,502,741  3/1996  Carroll et al. ............................. 372/96

OTHER PUBLICATIONS

Paper—Optical Fiber Communication Conference Technical Digest 24–26 Feb. 1986, Atlanta, Georgia, Independent Modulation in amplitude and frequency regimes by a multielectrode distributed–feedback laser pp. 32–33 Y Yoshikuni et al.

Article—Electronics Letters Dec. 3, 1987 vol. 23, No. 25 pp. 1371–1372, 'Formulas for direct frequency modulation response of two–electrode diode lasers: proposals for improvement.' O Nilsson et al.

Article—Electronics Letters Jun. 18, 1992 vol. 28 No. 13 pp. 1257–1258 'Line narrowed picosecond optical pulse generation using three contact InGaAsP/InP multiquntum well distributed feedback laser under gain switching'. I H White et al.

*Primary Examiner*—Rodney Bovernick
*Assistant Examiner*—Robert E. Wise
*Attorney, Agent, or Firm*—John D. Crane

[57] ABSTRACT

A DFB laser is provided with a top electrode divided symmetrically into two or three in-line separate elements through which a bias current is applied with a symmetrical distribution and through which a modulation current is applied in push-pull with a temporal asymmetry.

3 Claims, 8 Drawing Sheets

DIRECT AMPLITUDE MODULATION OF LASERS

BACKGROUND OF THE INVENTION

This invention relates to the control of chirp in high speed amplitude modulation of DFB lasers.

Modulation of the injection current of a semiconductor distributed feedback (DFB) laser is liable to produce variation in both the intensity and the wavelength of its emission. This wavelength variation is called chirp. Chirp imposes bandwidth limitations in amplitude modulated transmission systems that exhibit wavelength dispersion.

A paper entitled 'Independent modulation in amplitude and frequency regimes by a multi-electrode distributed—feedback laser' presented by Y Yoshikuni et al at the Feb. 25, 1986 Optical Fiber Communication Conference in Atlanta, Ga. describes a DFB laser with a uniform physical pitch grating where the top electrode of the laser is divided into three in-line sections, at least one of which is driven independently of the others. In particular, the paper states that differences in modulation efficiencies make it possible to modulate amplitude and frequency independently by adjusting the modulation current amplitude and phase applied to the divided electrode structure, and illustrates achieving amplitude modulation with minimum chirp by applying a first signal to the front portion of the divided electrode slightly ahead in phase of the application of a second signal of smaller amplitude to the centre portion of the divided electrode structure. Correspondingly frequency modulation with minimum amplitude modulation is described as being achieved with the first current being of larger amplitude than the second and in substantial antiphase (push-pull) relationship.

A paper by O Nilsson et al entitled, 'Formulas for Direct Frequency Modulation Response of Two-Electrode Diode Lasers: Proposals for Improvement', Electronics Letters 3rd December 1987, Vol 23, No 25, pages 1371–2 describes the theory of operation of a two-electrode laser structure designed for frequency modulation rather than for amplitude modulation. According to this theory thermal effects produce a phase shift, but it is postulated that the thermal effect could be avoided by pumping the laser in push pull. It is however particularly to be noted that this push-pull operation of a two-electrode laser is in the context of a device structured to provide frequency modulation rather than amplitude modulation, and the paper explains that the two sections are required to have different (x-parameters in order to provide the desired frequency modulation. Thus it is clear that this suggestion to employ push-pull is specifically in respect of a laser diode that is not symmetrical about the plane separating the two sections of that laser.

Neither of the above referenced papers is however directly concerned with dynamic chirp, by which term is meant the transient effects upon emission frequency occurring at the rising and falling edges of fast pulses. As the data rate is increased so this dynamic chirp assumes greater significance as a potential problem. Dynamic chirp is believed to result in major part from the effect of changes in total photon population in the laser associated with the rising and falling edges of the injection modulation current, and so the elimination of a frequency modulation response to injection current modulation in the manner proposed in the above references does not address the particular problem of dynamic chirp.

A paper that does address this dynamic chirp problem is the paper by I. H. White et al entitled 'Line Narrowed Picosecond Optical Pulse Generation Using Three Contact InGaAsP/InP multi-quantum Well distributed Feedback Laser under Gain Switching', Electronics Letters Vol. 28, No 13, pages 1257–8. As the title implies, the laser has a three section top electrode, of which the two end sections are electrically commoned. Dynamic chirp is reduced by arranging to gain-switch the commoned end sections while a constant bias is applied to the middle section in such a way as to provide an effective optical injection locking mechanism. The central region causes locking of the wavelength of gain-switched pulses generated by the electrical modulation applied to the end regions. This reduces chirp, but insofar as it still leaves a modulation of the photon population, the approach is not fully effective.

U.S. Pat. No. 5,502,741 is directed to the control of chirp and describes a method of amplitude modulating the optical emission of a DFB laser in such a way as to minimise dynamic chirp. To this end a DFB laser is provided with a top electrode divided symmetrically into two or three in-line separate elements through which a bias current is applied with a symmetrical distribution and through which a modulation current is applied with an antisymmetric (push-pull) distribution.

SUMMARY OF THE INVENTION

Accordingly it is a general object of the present invention to provide a method of amplitude modulating the optical emission of a DFB laser in such a way as to optimise dynamic chirp. Typically the DFB laser will be at the transmitter end of an optical transmission system, and optimised chirp will be the chirp that provides minimised eye closure penalty at the receiver end. Generally this optimised chirp condition will not be the same as the condition providing minimised dynamic chirp in the output from the DFB laser.

According to the present invention there is provided a method of amplitude modulating a distributed feedback (DFB) laser that has a DFB optical cavity defining an optical axis of laser emission therein, which optical cavity has a plane of substantial symmetry normal to said axis, in which method a bias current, which is distributed substantially symmetrically with respect to said plane of substantial symmetry is applied to the DFB optical cavity, upon which bias current is superimposed a modulation current that consists of data and inverse data components, wherein the data component has a distribution that is asymmetrically weighted with respect to the plane of symmetry and the inverse data component has a distribution that is a replica of the data component, not necessarily of the same amplitude, and wherein the data and inverse data components are applied with mirror symmetry with respect to the plane of symmetry with the data component phase-shifted with respect to the inverse data component so that they operate in phase-shifted push-pull mode.

The invention also provides a distributed feedback (DFB) injection laser having a DFB optical cavity defining an optical axis and which is provided with an electrode structure by means of which current can be injected into said cavity to cause the DFB laser to lase, wherein said structure is a divided structure that permits the current injection to be established with a distribution along the optical axis that can be varied, wherein the DFB optical cavity has a plane of substantial symmetry normal to the optical axis, which DFB laser is provided with drive means adapted to apply to the divided electrode structure a bias current disposed symmetrically with respect to the plane of symmetry of the optical cavity, to superimpose upon said bias current a modulation current that consists of data and inverse data components, wherein the data component has a distribution that is asymmetrically weighted with respect to the plane of symmetry and the inverse data component has a distribution that is a replica of the data component, not necessarily of the same amplitude, and to apply the data and inverse data components with mirror symmetry with respect to the plane of symmetry with the data component phase-shifted with respect to the inverse data component so that they operate in phase-shifted push-pull mode.

The invention further resides in an optical transmission system incorporating a laser as set out in the preceding paragraph.

BRIEF DESCRIPTION OF THE DRAWINGS

There follows a description of lasers, for use in optical transmission systems, and their modes of operation embodying the invention in preferred forms. In this description reference is made to the accompanying drawings in which.

DETAILED DESCRIPTION OF THE PREFERRED EMBODIMENTS

Figure 1:
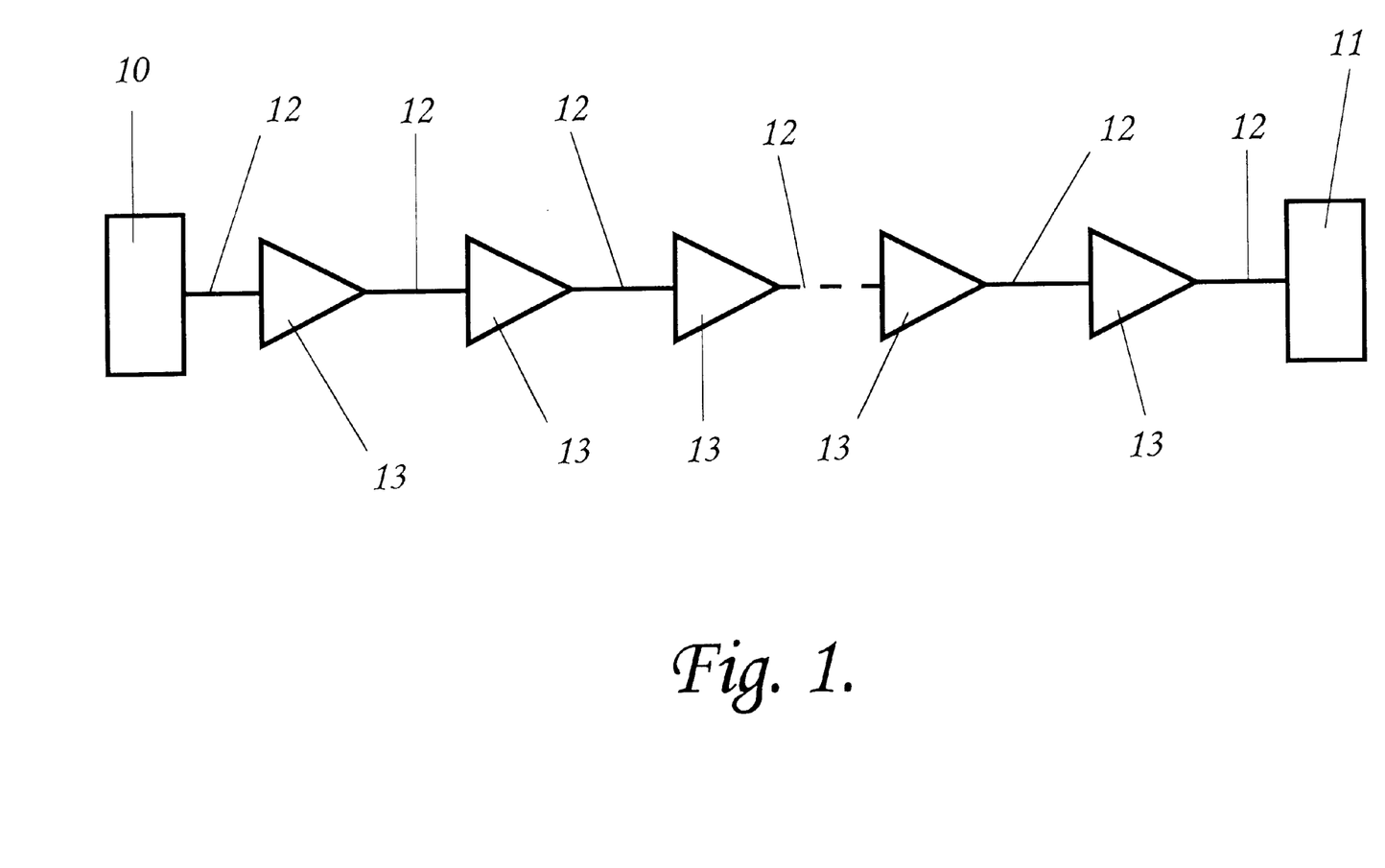
FIG. 1 schematically depicts an optical transmission system.

The basic elements of an optical transmission system are depicted in FIG. 1, and comprise a transmitter 10 optically coupled with an optical receiver 11 by means of a transmission path 12. Typically that transmission path may include a concatenation of optical amplifiers 13. In this instance the transmitter 10 includes at least one directly modulated DFB semiconductor laser (not separately illustrated in FIG. 1) and, in the case of a transmitter for a wavelength division multiplexed transmission system, will contain more than one of such lasers.

Figure 2:
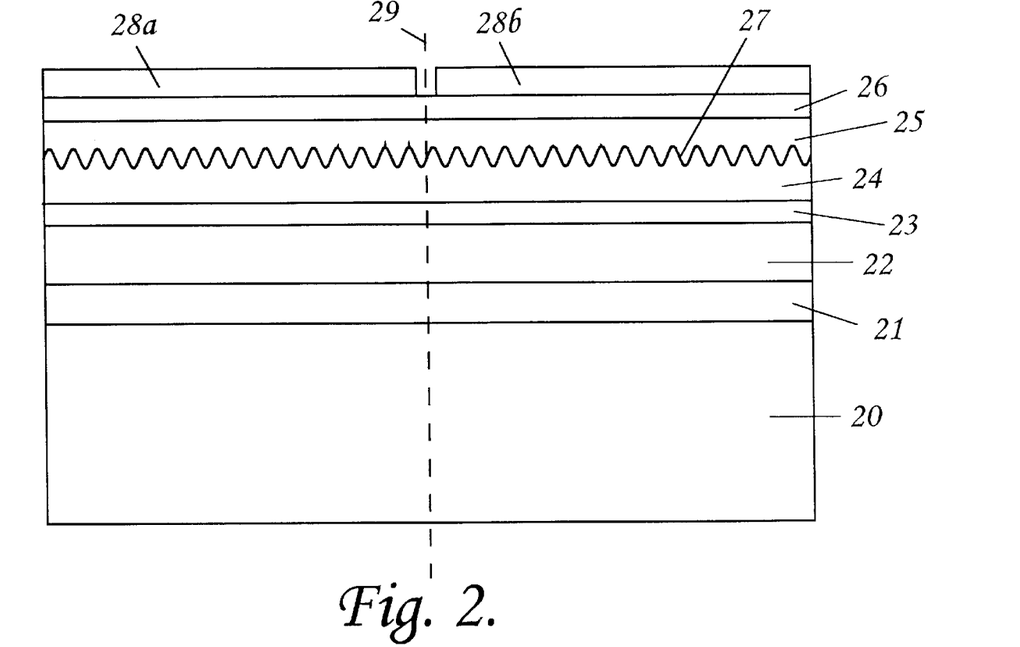
FIGS. 2 and 3 depict schematic longitudinal sections respectively of two-section and three-section top electrode DFB lasers.

A preferred form of basic semiconductor structure of DFB laser to which the method of amplitude modulation according to the present invention is applied is a conventional DFB laser structure with the single major difference that preferably the distributed feedback grating is without any phase shift. Such a basic semiconductor structure may for instance comprise, as depicted in FIG. 2, an n-type InP substrate 20 upon which is grown a series of epitaxially deposited layers commencing with an n-type InP buffer layer 21. On top of the buffer layer is grown an undoped quaternary lower waveguide layer 22, a multi-quantum well (MQW) structure 23, an undoped quaternary upper waveguide layer 24, a p-type InP cladding layer 25 and a p-type ternary contact layer 26. The MQW structure 23 may typically comprise about six quantum strained or unstrained well layers of ternary or quaternary material sandwiched between barrier layers which may have the same composition as that of the upper and lower waveguide layers 24 and 22. The epitaxial growth is temporarily halted after the growth of the upper waveguide layer in order to pattern the exposed surface of that layer to form, for instance by electron beam lithography, a DFB grating 27 before recommencement of the epitaxial growth to grow layers 25 and 26. In an alternative structure (not shown) the DFB grating is located beneath the MQW structure instead of on top of it, and is created immediately after growth of the buffer layer 21.

Figure 3:
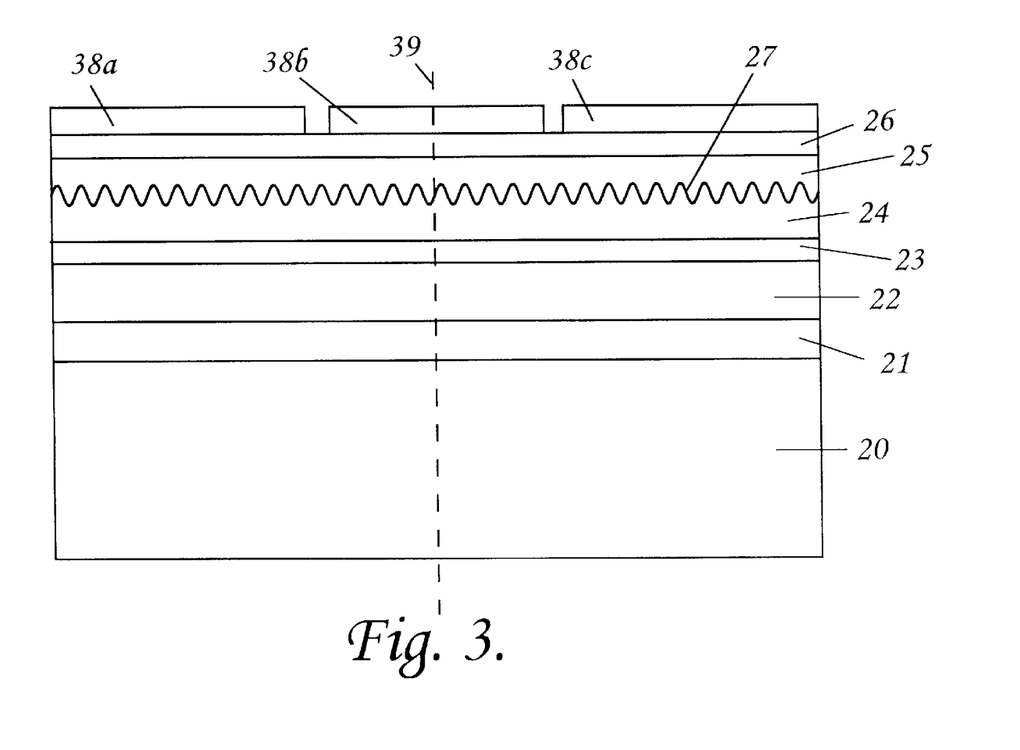

The above described layer structure provides waveguiding properties in the direction normal to the plane of the layers. Lateral waveguiding is also provided by known means, for instance by means of a ridge waveguide structure or by means of a buried heterostructure structure, and in this way an optical axis for the laser is defined, this axis extending in the plane of the layer in a direction at right angles to the direction in which the grating lines of the DFB structure 27 extend. Usually a DFB laser has a single top electrode making electrical contact with the contact layer 26, but in this instance the top electrode is divided into two in-line sections 28a, 28b as depicted in FIG. 2 or three in-line sections 38a, 38b, and 38c as depicted in FIG. 3.

The arrangement of the top electrode sections is such as to retain a plane of substantial symmetry (indicated by a broken line 29, 39) for the semiconductor laser structure and its electrode structure. The laser is thus provided with a structure that confines the photons laterally and perpendicular to the plane of the epitaxial layers, and now by means of the divided top electrode structure is provided with a facility for modulating the distribution of the photons along the optical axis of the laser by modulation of the distribution of the injection current applied to the laser via its top electrode structure. In accordance with the teachings of U.S. Pat. No. 5,502,741, the laser is supplied with a bias current that is distributed substantially symmetrically with respect to the symmetry plane 29, 39, and on this is superimposed a modulation current that is distributed substantially anti-symmetrically (i.e. in push pull) with respect to that plane. The modulation has the effect of shifting the centre of gravity of the total photon population axially back and forth along the optic axis while maintaining that population (photonic energy) substantially constant. In the case of the two-element top electrode configuration of FIG. 2, these symmetry relationships are provided by applying, to the respective elements 28a and 28b, currents of the form $(i_b \pm i_m)$ and $(i_b \mp i_m)$, where $i_b$ is the bias current and $i_m$ is the modulation current. (For the sake of illustration, under the condition $i_b = i_m$, the total current drive would alternate between application solely through element 28d and application solely through element 28b). In the case of the three-element top electrode configuration of FIG. 3, the required symmetry relationships are provided by applying, to the respective elements 38a, 38b and 38c, currents of the form $(i_{b1 \pm im})$, $i_{b2}$ and $(i_{b1} \mp i_m)$.

According to the teachings of the present invention, the bias current is applied in the same way, but the modulation current is applied with a phase difference between the application of $\pm i_m$ to terminal 28a or 38a and the application of $\mp i_m$ to terminal 28b or 38b. In the case of a laser structure with a more complex top electrode structure in which the current $\pm i_m$ is not applied in its entirety to a single electrode, but is distributed between two or more electrodes, this distribution needs to be asymmetrically weighted with respect to the plane of symmetry 29, 39. The current $\mp i_m$ (which is the inverse of the current $\pm i_m$) is applied with a similarly weighted distribution that is the mirror image, in the plane of symmetry, of the distribution of the current $\pm i_m$.

Additional to the asymmetry of drive conditions produced by the existence of a phase difference between the application of $\pm i_m$ and $\mp i_m$, there may also be an asymmetry in the relative amplitudes of the two drive currents so as to provide $\pm ki_m$ and $\mp i_m$, where k is a constant differing from unity. In order to distinguish clearly between these two forms of asymmetry, the asymmetry introduced by differences in relative amplitudes of the modulation current will be termed modulation depth asymmetry, while that produced by differences in their phases will be termed temporal asymmetry. To discuss these effects it is convenient to adopt a convention to define what is meant by positive and negative in respect of both these types of asymmetry. Accordingly, positive modulation depth asymmetry is defined as the condition in which the modulation depth on the side of the plane of symmetry remote from the output facet of the laser exceeds that on the nearer side. Thus under conditions of positive modulation depth asymmetry the energy stored in the laser decreases as a pulse turns the laser on. Positive temporal asymmetry is defined as the condition in which the modulation applied on the side of the plane of symmetry remote from the output facet of the laser is applied in advance of that applied on the nearer side.

Figure 4:
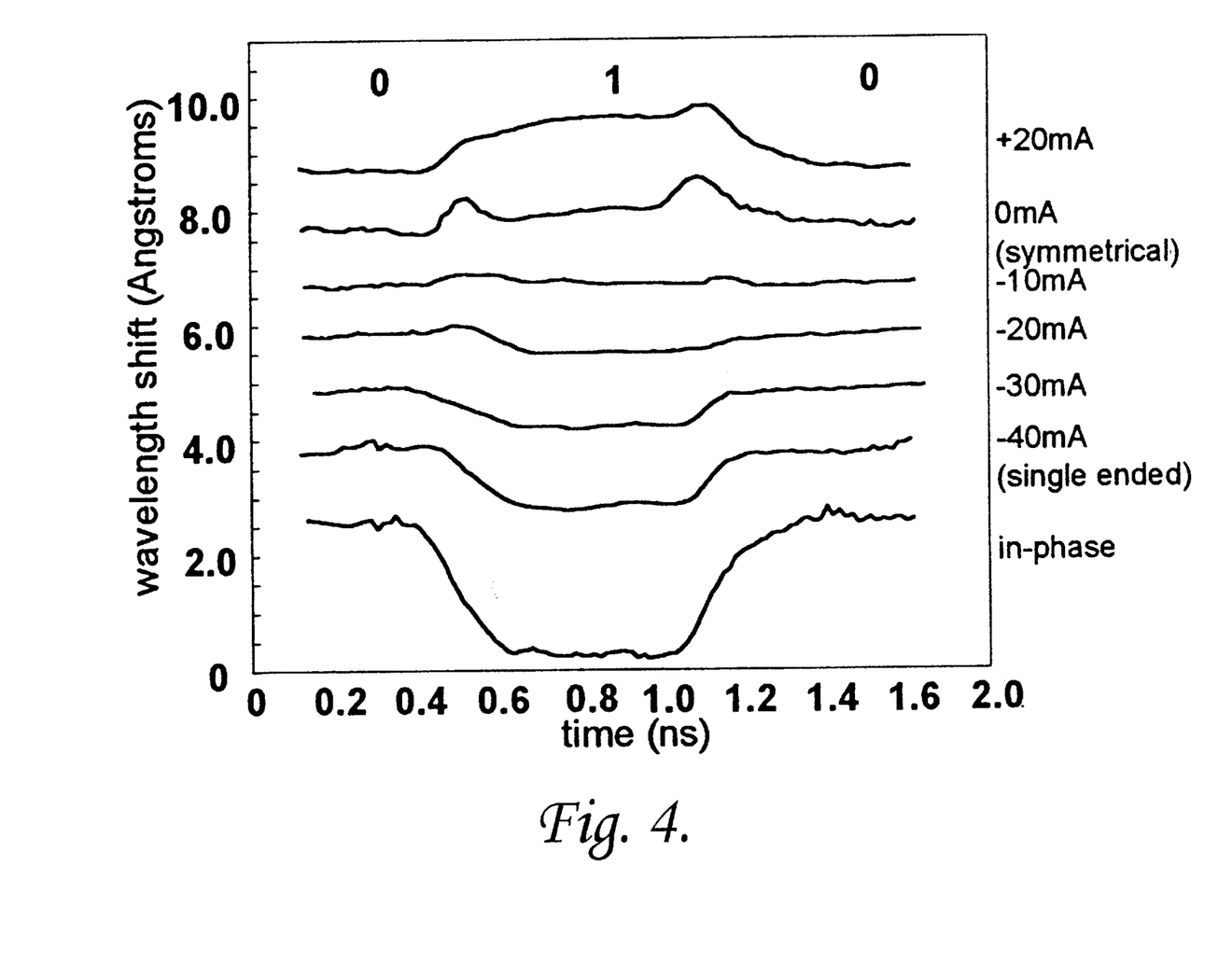
FIG. 4 is a set of plots illustrating the chirp for different levels of amplitude asymmetry in the laser drive.

FIG. 4 illustrates how, in respect of a particular example of laser constructed as depicted in FIG. 3, the varying of the degree of modulation depth asymmetry in the absence of any temporal asymmetry affects the chirp present in its output when modulated with the bit sequence '0, 1, 0'. The traces of FIG. 4 were obtained by applying a constant current to terminal 38b of the laser, and switching the current applied to the terminal 38c, arbitrarily designating this as the terminal of terminals 38a and 38c nearer the output facet, between 0 mA and 40 mA. The different traces were produced by applying different values of current to terminal 38a, the terminal remote from the output facet. In respect of the trace labelled 'in-phase', the current applied to terminal 38a was 40 mA applied in phase with that applied to terminal 38c. In respect of the other traces of FIG. 4, the current applied to terminal 38a is applied in antiphase with respect to the application of the current to terminal 30c. The labelling of the traces, other than the 'in phase' trace, is in respect of asymmetry. Thus in the case of the trace labelled 0 mA, the current applied to terminal 38a was switched between 40 mA and 0 mA. In the case of the trace labelled −40 mA, the current applied to the terminal 38a was switched between 0 mA and 0 mA, i.e. the current drive was single ended. From considerations of symmetry one would have expected the 0 mA trace to have been the flattest: the fact that the −10 mA trace turns out to be flatter implies some departure from perfect physical symmetry of the specific laser under test.

Figure 5:
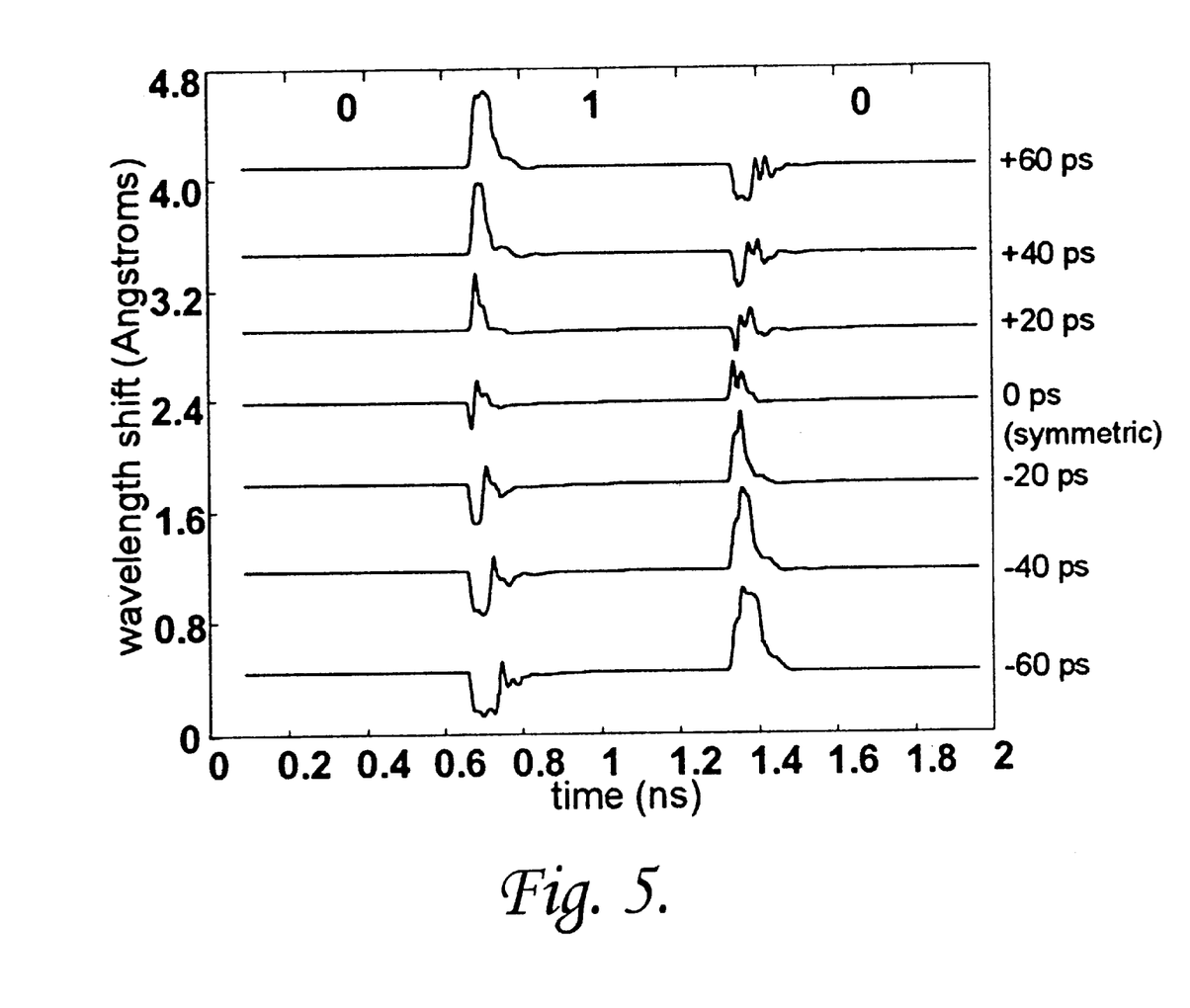
FIG. 5 is a set of plots illustrating the chirp for different levels of temporal asymmetry in the laser drive.

Attention is now turned to the effects of temporal drive asymmetry. FIG. 5 shows the simulated results in respect of different amounts of temporal asymmetry in the application of push-pull current drive applied to a laser constructed as depicted in FIG. 3. This simulation was in respect of modulation at 1.5 Gb/s with a '0,1,0' bit sequence with a d.c. bias on contact 38b of 50 mA, a d.c. bias of 22.5 mA on each end contact 38a and 38c, and a modulation depth of 40 mA on the end contacts. The simulation was based on the time domain modelling as described by C F Tsang et al, "Comparison between 'power matrix model (PMM)' and 'time domain model (TDM)' in modeling large signal responses of DFB lasers," IEE Proc. J vol. 141, no. 2, pp 89–96, Apr. 1994, and by L M Zhang et al, "Dynamic analysis of radiation and side mode suppression in second order DFB lasers using time-domain large signal travelling wave model," IEEE J. Quantum Electron., vol. 30, no. 6, pp. 1389–1395, June 1994. It can be seen from FIG. 5 that, by changing the temporal asymmetry from positive to negative, or vice versa, the wavelength deviations at the turn-on and turn-off of a pulse can be caused to change sign whilst maintaining the overall symmetry of the drive such that the emission wavelength in the body of a data 1 matches that in the body of a data 0.

This effect can be understood by considering the change in stored energy and mean carrier density. A pulse is turned on by switching off the contact further from the output and switching on the contact nearer the output. For a positive temporal asymmetry, the switching off of the more remote contact leads the switching on of the nearer contact, and so as a pulse turns on there is a transient decrease in mean carrier density and stored energy before the nearer contact is turned on. Such a transient decrease is associated with a transient positive emission wavelength shift.

At the turn off, the switching on of the more remote contact leads the switching off of the nearer contact, and so at this juncture there is a transient increase in mean carrier density and stored energy, such a transient being associated with a transient negative emission wavelength shift. The effects are interchanged in the change of a negative temporal asymmetry because in this instance an increase in mean carrier density and stored energy is associated with turn on and a decrease with turn off.

Figure 6:
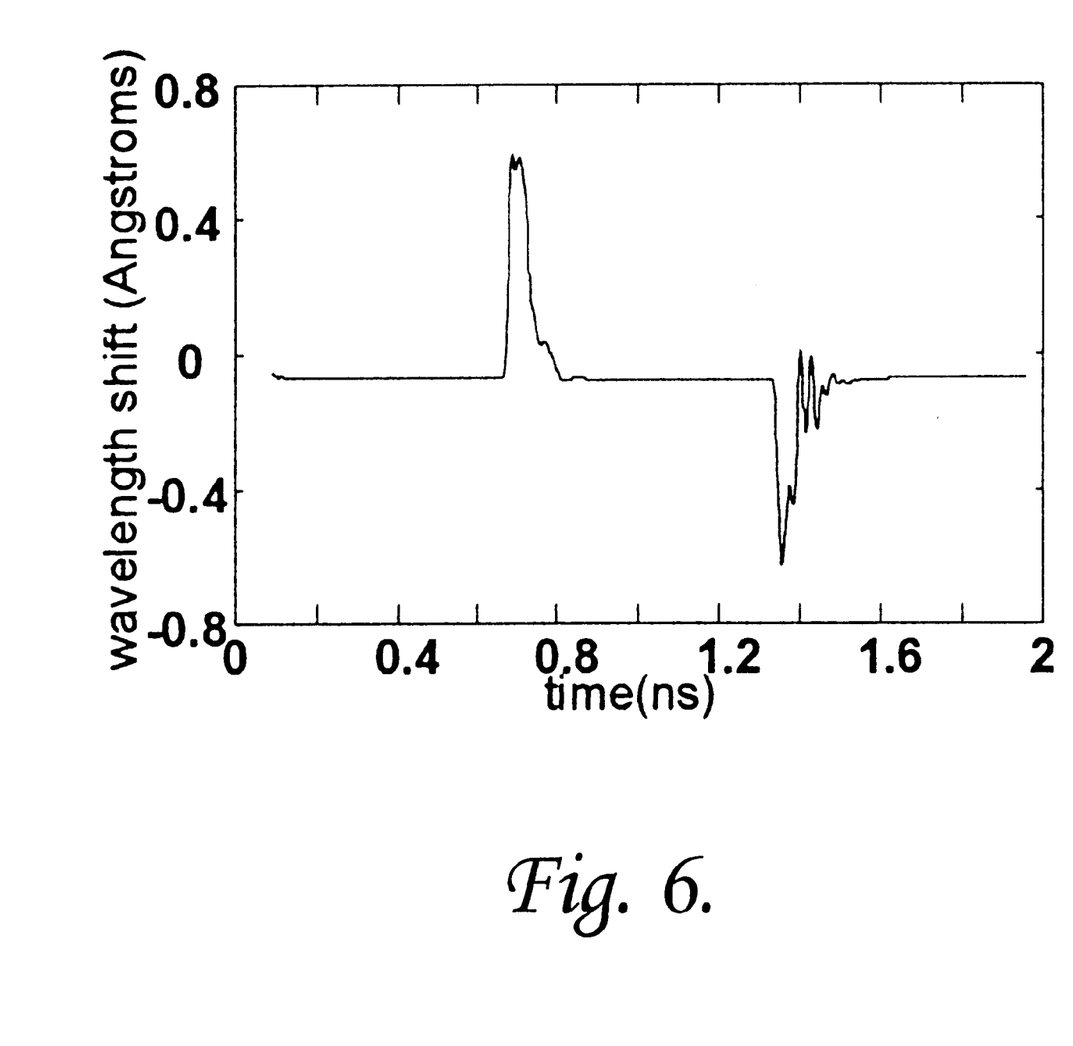
FIGS. 6 is a further plot illustrating the chirp for a specific value of temporal asymmetry with d.c. bias asymmetry.

FIG. 6 shows a further trace in which the temporal asymmetry was +60 ps, but this time in the presence of a bias level asymmetry of +10 mA.

Figure 7:
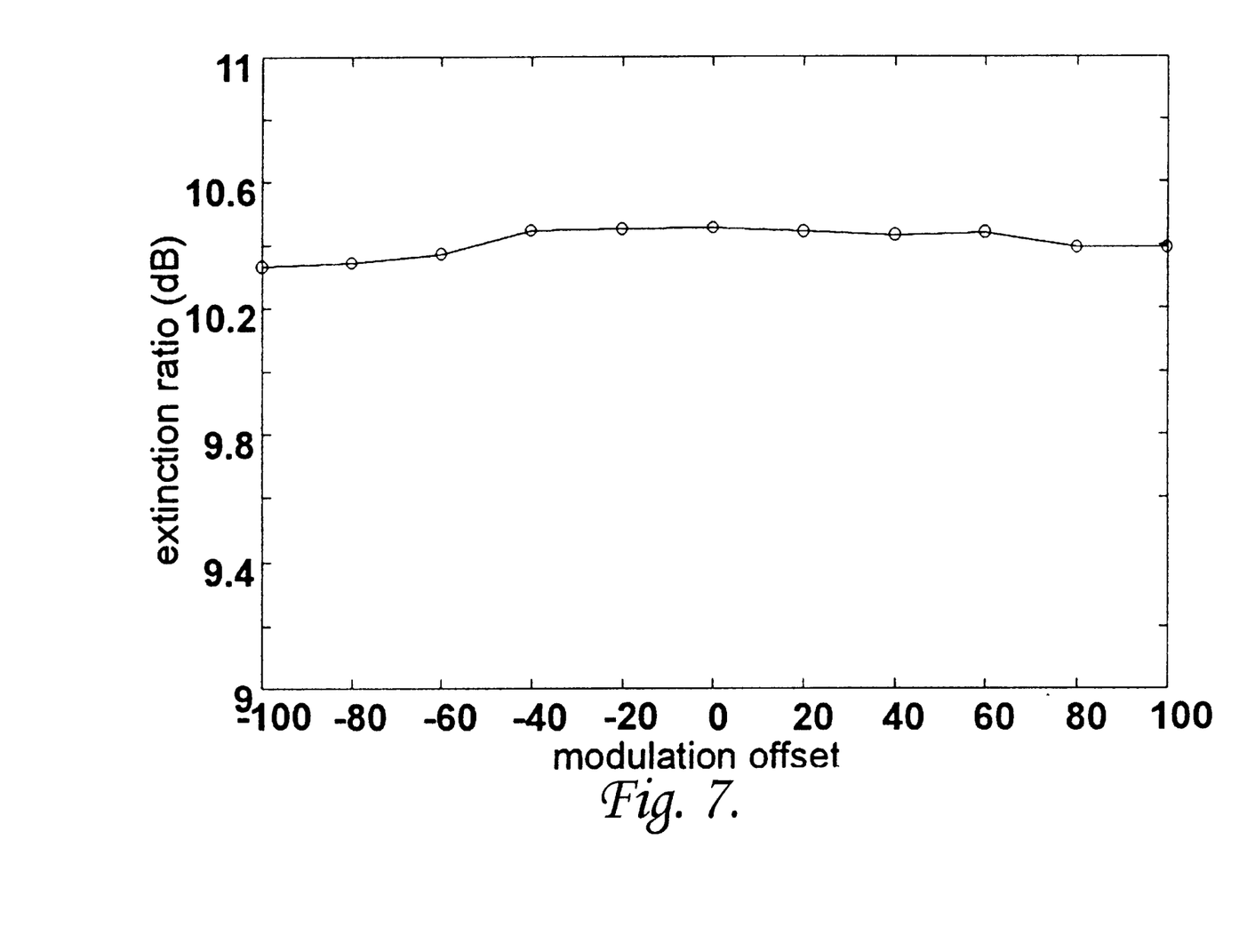
FIG. 7 is a plot illustrating the variation in extinction ratio with temporal asymmetry in the laser drive.

FIG. 7 shows how the extinction ratio varies with temporal asymmetry using the same drive conditions as described above with reference to FIG. 5. This shows that the offset does not significantly affect extinction ratio.

Figure 8A:
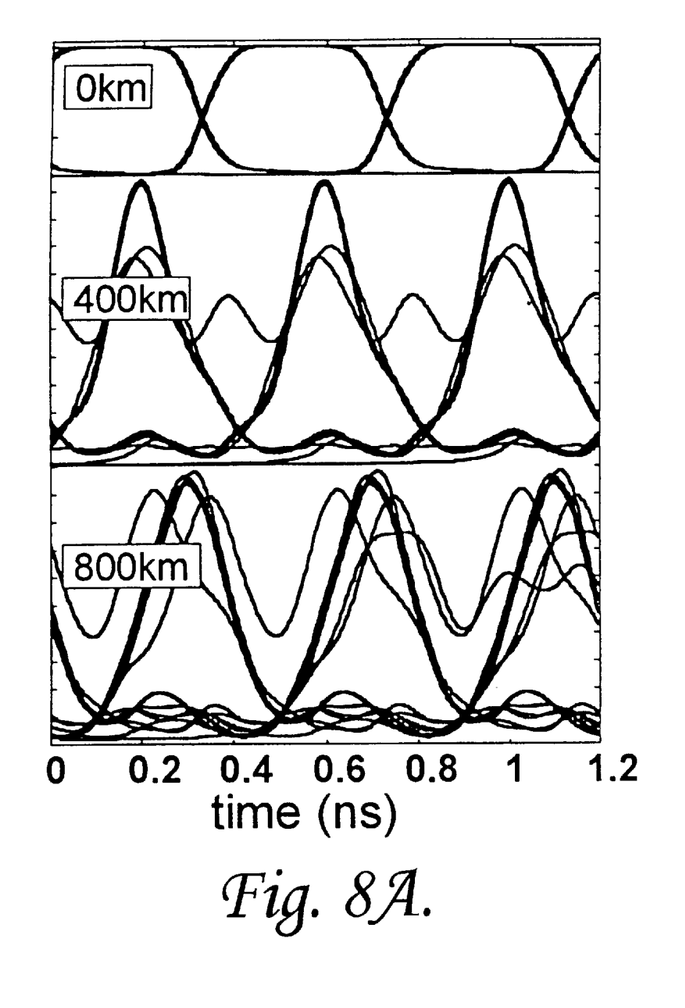
FIGS. 8A and 8B are simulated eye diagrams respectively for positive and negative temporal asymmetry, and FIG. 9 depict plots of eye closure against transmission distance for different amounts of temporal asymmetry.
Figure 8B:
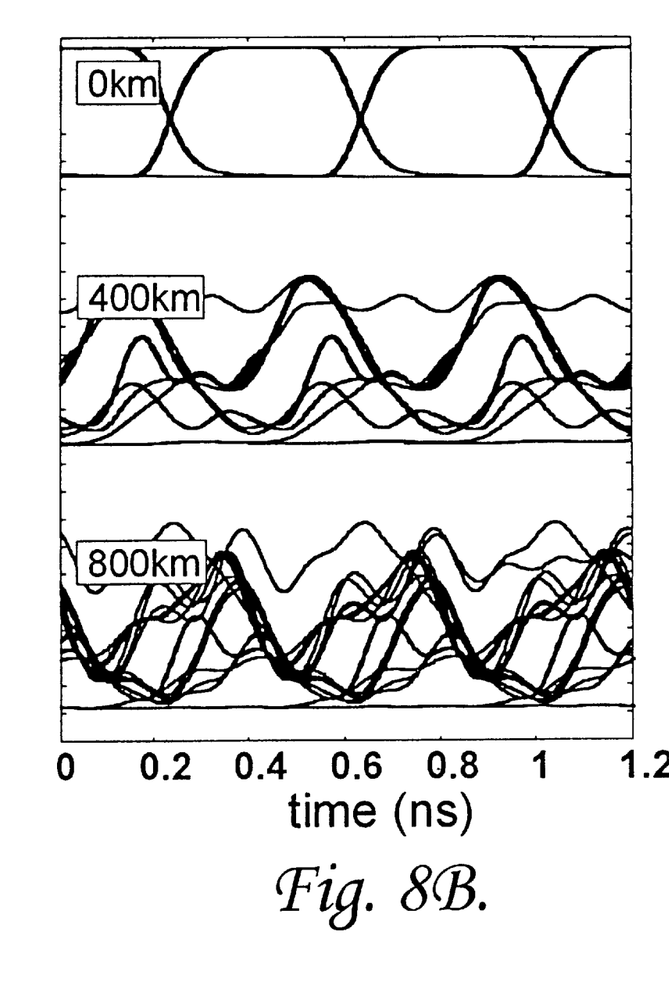
Figure 9:
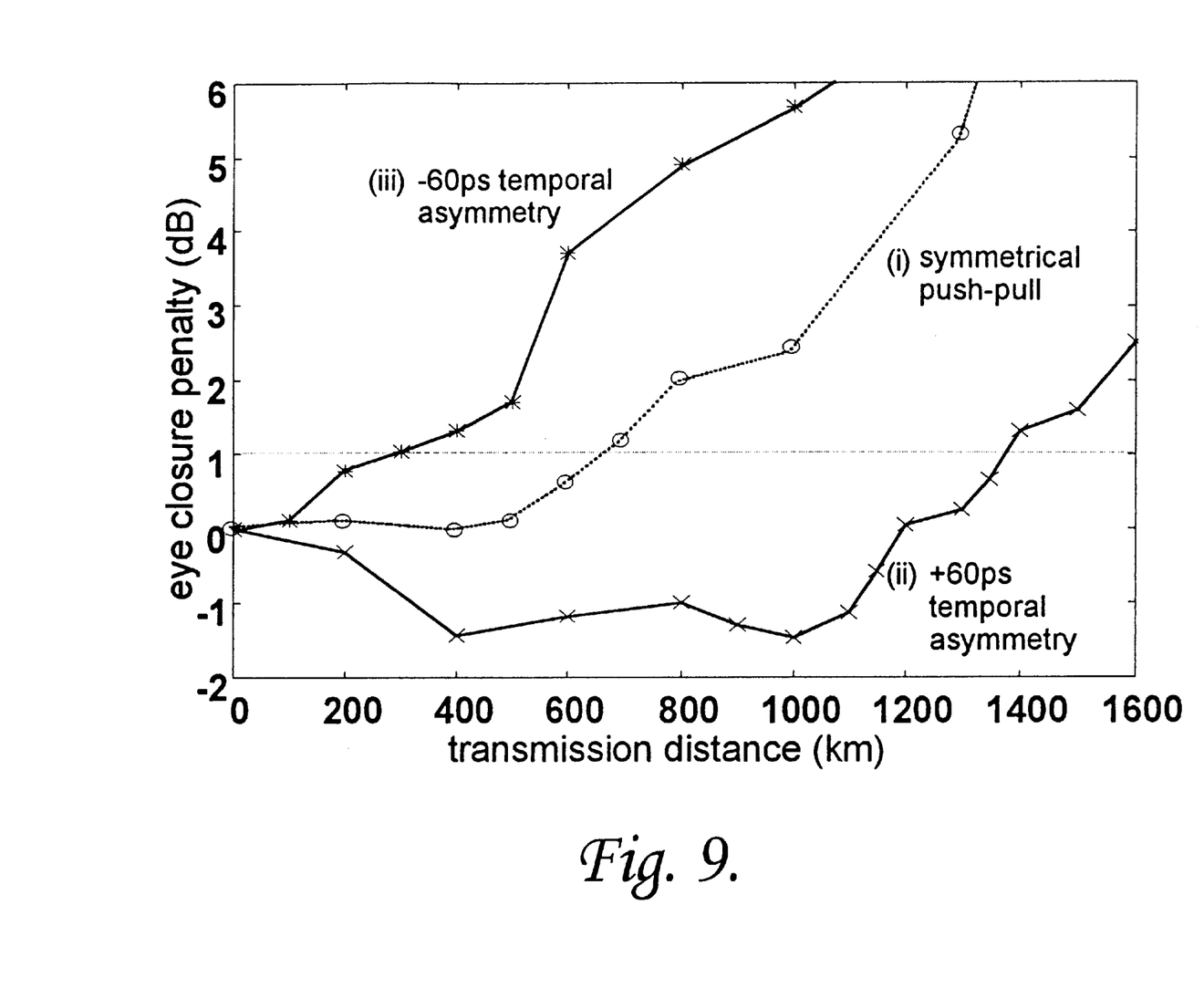

FIG. 8 shows the eye diagrams, and FIG. 9 shows the effect on the eye closure plot when positive and negative temporal asymmetry are applied in the manner described above with reference to FIG. 5 using a +60 ps temporal asymmetry. It can be seen that positive temporal asymmetry results in very strong pulse compression and can significantly improve the transmission distance to beyond 1200 km for a 1 dB eye closure, whereas negative temporal asymmetry causes the eye to close more rapidly. This can be explained by considering the time resolved chirp shapes. The red and blue wavelength shifts at the leading and trailing edges of the pulse cause the edges to move together as the pulse propagates, giving strong compression similar to that which occurs for a negative chirp external modulator. The opposite occurs when a negative temporal asymmetry is applied and the edges rapidly spread apart. The use of temporal asymmetry therefore affords the opportunity for transmission performance comparable with that of a negative chirp external modulator.

The precise form of optimisation of the chirp will depend on the laser structure and the dispersion in the fibre link. An important point is that it is not necessarily the lowest level of chirp which will provide the best performance; rather it is the shape of the time resolved chirp which is important. Push-pull modulation offers the potential to tailor this shape, and a comparison can be made with an external modulator. An external modulator can allow a pulse to be 'pre-chirped', i.e. the spectral shape is tailored to compensate for a given dispersion in a fibre. With appropriate biasing, an external modulator can provide negative chirp allowing large transmission spans. Similarly, with push-pull modulation, the chirp can be tailored to provide a pre-chirped pulse to compensate for dispersion, and with appropriate temporal asymmetry a negative chirp shape similar to that obtained from an optimised external modulator can be obtained, but with the advantages of cost and simplicity offered by a directly modulated source.

We claim:

1. A method of amplitude modulating a distributed feedback (DFB) laser that has a DFB optical cavity defining an optical axis of laser emission therein, which optical cavity has a plane of substantial symmetry normal to said axis, in which method a bias current, which is distributed substantially symmetrically with respect to said plane of substantial symmetry is applied to the DFB optical cavity, upon which bias current is superimposed a modulation current that consists of data and inverse data components, wherein the data component has a distribution that is asymmetrically weighted with respect to the plane of symmetry and the inverse data component has a distribution that is a replica of the data component, not necessarily of the same amplitude, and wherein the data and inverse data components are applied with mirror symmetry with respect to the plane of symmetry with the data component phase-shifted with respect to the inverse data component so that they operate in phase-shifted push-pull mode.

2. A distributed feedback (DFB) injection laser having a DFB optical cavity defining an optical axis and which is provided with an electrode structure by means of which current can be injected into said cavity to cause the DFB laser to lase, wherein said structure is a divided structure that permits the current injection to be established with a distribution along the optical axis that can be varied, wherein the DFB optical cavity has a plane of substantial symmetry normal to the optical axis, which DFB laser is provided with drive means adapted to apply to the divided electrode structure a bias current disposed symmetrically with respect to the plane of symmetry of the optical cavity, to superimpose upon said bias current a modulation current that consists of data and inverse data components, wherein the data component has a distribution that is asymmetrically weighted with respect to the plane of symmetry and the inverse data component has a distribution that is a replica of the data component, not necessarily of the same amplitude, and to apply the data and inverse data components with mirror symmetry with respect to the plane of symmetry with the data component phase-shifted with respect to the inverse data component so that they operate in phase-shifted push-pull mode.

3. An optical transmission system having an optical receiver optically coupled via a transmission path with an optical transmitter that includes a DFB laser as claimed in claim 2.

* * * * *